(12) United States Patent
Lee et al.

(10) Patent No.: US 6,284,566 B1
(45) Date of Patent: Sep. 4, 2001

(54) CHIP SCALE PACKAGE AND METHOD FOR MANUFACTURE THEREOF

(75) Inventors: Shaw Wei Lee, Cupertino; Hem P. Takiar, Fremont; Ranjan J. Mathew, San Jose, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/387,170

(22) Filed: Aug. 31, 1999

Related U.S. Application Data

(63) Continuation-in-part of application No. 08/649,395, filed on May 17, 1996, now Pat. No. 5,783,866.

(51) Int. Cl.[7] .................................................. H01L 21/44
(52) U.S. Cl. ........................ 438/107; 438/106; 438/109; 438/110
(58) Field of Search ................................. 438/106, 107, 438/109, 118, 119, 124, 127, 613, 110, 112; 257/780, 697, 702

(56) References Cited

U.S. PATENT DOCUMENTS

| 4,082,394 | 4/1978 | Gedney et al. ..................... 339/17 |
| 4,322,778 | 3/1982 | Barbour et al. ................... 361/414 |
| 5,355,283 | 10/1994 | Marrs et al. ...................... 361/760 |
| 5,537,051 | * 7/1996 | Jalloul et al. ..................... 324/758 |
| 5,652,185 | * 7/1997 | Lee .................................... 437/219 |
| 5,777,381 | * 7/1998 | Nishida ............................. 257/693 |
| 5,977,617 | * 11/1999 | Kata .................................. 257/668 |
| 5,994,773 | * 11/1999 | Hirakawa .......................... 257/702 |

FOREIGN PATENT DOCUMENTS

| 248 907 | 8/1987 | (DE) | ............................ H01L/23/12 |
| 36 19 636 | 12/1987 | (DE) | ............................ H01L/23/50 |
| 196 22 650 | 12/1996 | (DE) | ........................... H01L/23/055 |
| 55-107239 | 8/1980 | (JP) | ............................ H01L/21/58 |
| 5-144995 | 11/1993 | (JP) . | |
| WO 96/13056 | 5/1996 | (WO) | ............................ H01L/27/52 |

* cited by examiner

*Primary Examiner*—Matthew Smith
*Assistant Examiner*—Victor V. Yevsikov
(74) *Attorney, Agent, or Firm*—Skjerven Morrill MacPherson LLP; Edward C. Kwok

(57) ABSTRACT

An assembly process provides a chip scale package (CSP) which characteristically includes (i) a perforated substrate in which vias can be embedded, (ii) a solder mask on which the integrated circuit die can be attached, and (iii) efficient use of the surface area for electrically routing signals from the integrated circuit die to the external terminals attached to the perforated substrate. The resulting package is highly compact and therefore has a foot print minimally larger than the surface area of the integrated circuit chip. Consequently, the costs of substrate and capsulation materials are minimized. The assembly process allows very high volume production because a large number of integrated circuits can be made on a single unit of the substrate, and singulation is performed in the assembly process at a stage much later than the corresponding stage in a conventional process.

13 Claims, 9 Drawing Sheets

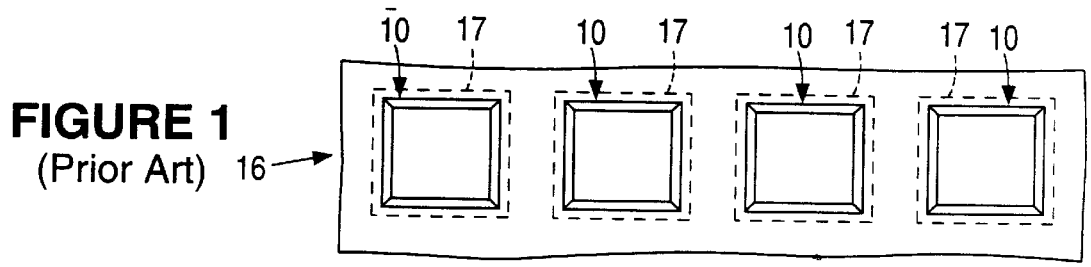
FIGURE 1
(Prior Art)
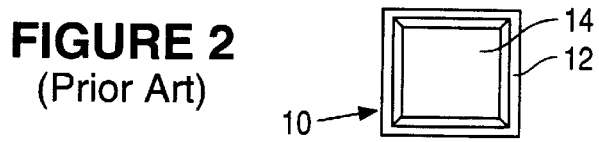
FIGURE 2
(Prior Art)
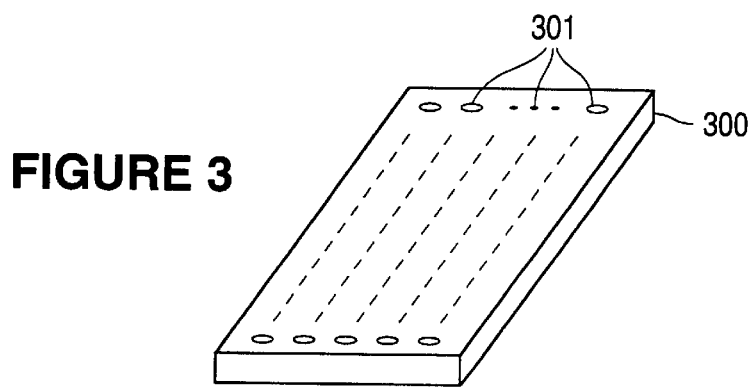
FIGURE 3
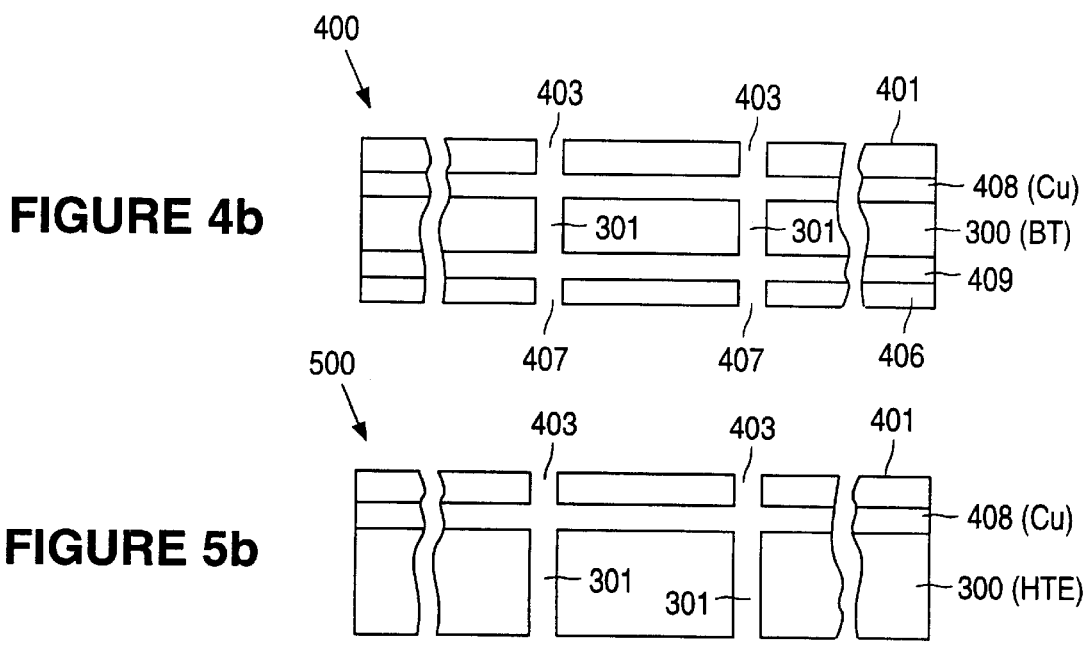
FIGURE 4b
FIGURE 5b

CHIP SCALE PACKAGE AND METHOD FOR MANUFACTURE THEREOF

CROSS REFERENCE TO RELATED APPLICATION

The present application is a continuation-in-part application of a U.S. patent application ("Parent Application"), Ser. No. 08/649,395, filed May 17, 1996, entitled "LOW COST BALL GRID ARRAY DEVICE AND METHOD OF MANUFACTURE THEREOF," by S. Lee et al., assigned to National Semiconductor Corporation, which is also the assignee of the present application. The Parent Application is hereby incorporated by reference in its entirety and is now U.S. Pat. No. 5,783,866.

FIELD OF THE INVENTION

This invention relates to semiconductor packages and methods of fabrication thereof, and more particularly to a low cost packages adaptable to low input/output count devices.

BACKGROUND OF THE INVENTION

Plastic ball grid array devices (PBGA) provide has a large number of advantages over other package types, e.g. pin grid arrays. In a typical PBGA package 10 (FIG. 2), a printed circuit board (PCB) made from such material as bismaleimide triazine (BT) resin or ceramic ($Al_2O_3$) is used as a substrate 12. In such a package, a silicon integrated circuit (IC) die is attached on one side of substrate 12, with solder balls on the opposite side of substrate 12, and the silicon IC is encapsulated by a molding compound 14.

Electrical connection between the silicon IC die and the solder balls are achieved by wire bonding, or by means of a flip-chip connection, to conductors or traces on the "die side" surface of substrate 12, from such conductors to traces, and then through vias to the opposite side of substrate 12, at which other conductors or traces are provided to couple the solder balls.

At present, BGA technology is cost-effective for applications in which a large number of "I/Os" or "pins" per package are required. For example, popular BGA packages include 119, 169, 225, 256, 313, 352, 420 or 625 balls. Although semiconductor devices requiring a lower number of I/O pins are very common, it is expensive to provide BGA packages at such low number of I/O's. If BT is used as the material for substrate 12, for example, the BT material cost may account for 50% of the package.

Typically, BT or ceramic is provided in single-element form 16 (FIG. 1) with dimensions of, for example, 45 mm by 187.5 mm. A manufacturer of BGA packages attempts to lay out the packages to maximize area utilization of element 16. In element 16, the completed devices 10 are singulated (indicated by the dotted lines 17 on the element 16) to result in individual BGA devices 10 (FIG. 2). The remaining portions of element 16 are simply discarded. Such discarded portions may amount to 20 to 40% of the total area of element 16. Clearly, therefore, minimize such discarded portions of the element 16 would significantly reduce manufacturing cost, making the significant advantages of PBGA packages available to smaller packages.

SUMMARY OF THE INVENTION

The present invention provides an assembly process for manufacturing chip scale packages. The assembly process includes the steps of: (i) providing a perforated substrate; (ii) attaching to the perforated substrate a plurality of semiconductor dies; (iii) providing an electrically insulative covering over the plurality of semiconductor dies to form a sealed structure which includes the insulative covering and the perforated substrate, so as to enclose the semiconductor dies; and (iv) singulating the sealed structure into chip scale packages, such that each chip scatle package includes one of the semiconductor dies. In one embodiment, the perforated substrate is provided a conductive pattern for connecting the terminals of the semiconductor dies. In one implementation, the conductive pattern is a metallic bondable structure, to allow wire bonding to the bonding pads of the integrated circuit on the semiconductor die.

According to another aspect of the present invention, preformed bumps or vias can be provided in the perforated substrate, to enhance efficiency in the assembly process.

The assembly process of the present invention allows an electrical testing step to be performed prior to performing singulation. In this manner, efficiency and cost savings can be achieved by testing a large number of integrated circuit dies in parallel, and without incurring the costs of customized receptacles for holding the individual integrated circuits during testing.

The singulation step of the assembly process-of the present invention can be achieved by an inexpensive sawing step using a diamond saw with serrated blades. The chip scale packages can be (i) encapsulated in plastic, using a transfer molding method, (ii) protected by a die coating using, for example, a screening process, or (iii) hermetically sealed using a ceramic cap and a suitable sealant.

In accordance with another aspect of the present invention, the present invention provides a chip scale package which includes (i) a perforated substrate; (ii) an electrically conductive pattern on one side of the perforated substrate, for providing a first set of electrically conductive paths from selected positions of the conductive pattern to the through holes in the perforated substrate; (iii) a solder mask to provide access from the bonding pads of the integrated circuit die to the selected positions; (iv) external terminals coupled to the conductive pattern to provide a second set of conductive paths in the through holes of the perforated substrate; and (v) a covering provided to form, in conjunction with the substrate, an enclosure enclosing the integrated circuit die and the first and second sets of electrically conductive paths, exposing only the external terminals. In such a chip scale package, the external terminals can be provided by solder balls, and the second set of conductive paths can be provided by through hole plating or a solder flux.

The present invention can be used to provide a package in which the integrated circuit die is attached to the solder mask in either a "die-up" configuration or a "die-down" configuration. The electrical connections between the bonding pads of the integrated circuit die and the first set of conductive patterns can be provided by bond wires between the bonding pads and the conductive patterns on the perforated substrate, accessed through openings in the solder mask.

The present invention provides (i) a perforated substrate in which vias can be embedded, (ii) a solder mask on which the integrated circuit die can be attached, and (iii) efficient use of the surface area for electrically routing signals from the integrated circuit die to the external terminals attached to the perforated substrate. The resulting package is highly compact and therefore has a footprint minimally larger than the surface area of the integrated circuit chip. Consequently, the costs of substrate and capsulation materials are minimized. The assembly process allows very high volume production because a large number of integrated circuits can be made on a single unit of the substrate, and singulation is performed in the assembly process at a stage much later than the corresponding stage in a conventional process, resulting in a very high throughput.

The present invention provides chip scale packages that are assembled in a particularly efficient manufacturing process and minimizes wastage of packaging material.

DESCRIPTION OF THE DRAWINGS

FIG. 1 is a plan view of a standard size substrate element having BGA devices formed thereon.

FIG. 2 is a plan view of an individual singulated BGA device of FIG. 1.

FIG. 3 shows a perforated substrate 300 in one embodiment of the present invention.

FIGS. 4a and 4b show, in perspective and side views, perforated substrate 400.

FIGS. 5a and 5b show, respectively in perspective and side views, a perforated substrate 500.

FIGS. 7b–7h show the various stages of a CSP at various steps of the assembly process of FIG. 7a.

DESCRIPTION OF THE PREFERRED EMBODIMENTS

Figure 4A:
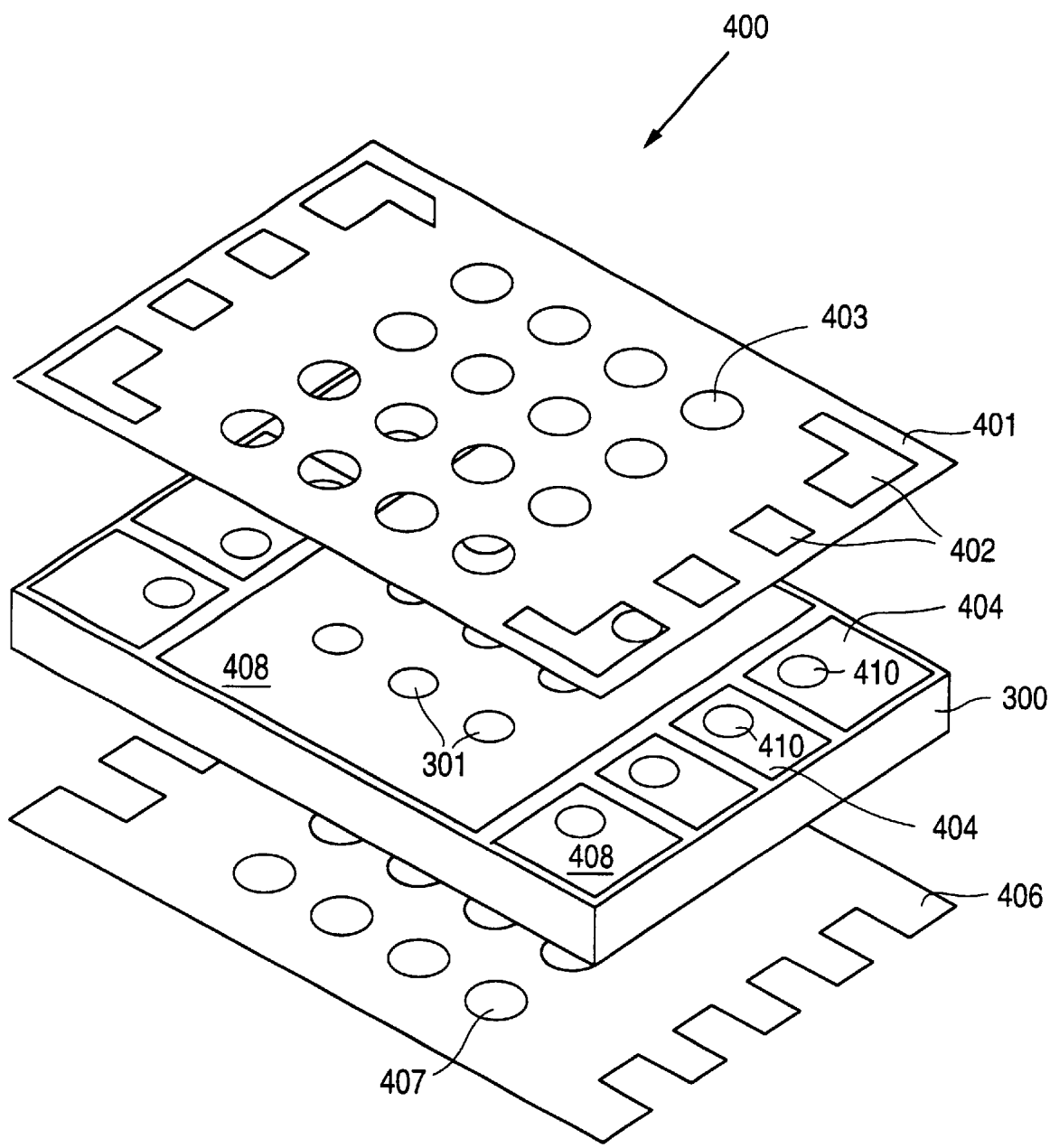

The present invention provides a low-cost heat performance enhanced package for an integrated circuit die, using a perforated substrate. In a typical package of the present invention, the perforated substrate consists of at least one solder mask, a conductor layer, and a perforated substrate core, which includes an array of perforations. In such a package, the conductor layer provides electrical connections between an integrated circuit die attached to the perforated substrate and the regular array of perforations. The regular array of perforations provide vias through which conductor traces of a printed circuit board ("system board"), on which the integrated circuit is installed, can be coupled to the conductor layer and thereby, to the terminals of the integrated circuit die. Other variations within the scope of the present invention are possible.

An example of a perforated substrate core is shown in FIG. 3. As shown in FIG. 3, perforated substrate core 300 includes a regular array of perforations 301. Perforations 301 can be arranged over a universal grid, at a pitch of 50 mile, for example. As described above, in low pin-count packages, perforated substrate core 300 can replace a conventional lead frame. Perforated substrate core 300 can be formed using any rigid material, for example, using bismaleimide triazine (BT) or any suitable high temperature epoxy. Other possible materials include (i) ceramic material, (ii) flexible circuits rigidized by laminates, and (iii) any two-sided laminated substrate. A copper conductor can be provided on one or both sides of these substrates using, for example, a plated or cladded copper film.

In the present description, to facilitate comparison between figures, like elements in these figures are provided like reference numerals.

A perforated substrate in one embodiment of the present invention is shown in perspective and side views in FIGS. 4a and 4b respectively. In FIGS. 4a and 4b, a perforated substrate 400 includes a first solder mask 401, a conductor layer 408 formed on one surface of perforated substrate core 300, and a second solder mask 406. An additional conductor layer 409 can be also be provided on the side of perforated substrate core 300 opposite to the side on which conductor layer 408 is formed. Solder mask 401 includes openings 402 at the periphery and openings 403 at positions corresponding to openings 301 of perforations substrate core 300.

Figure 6:
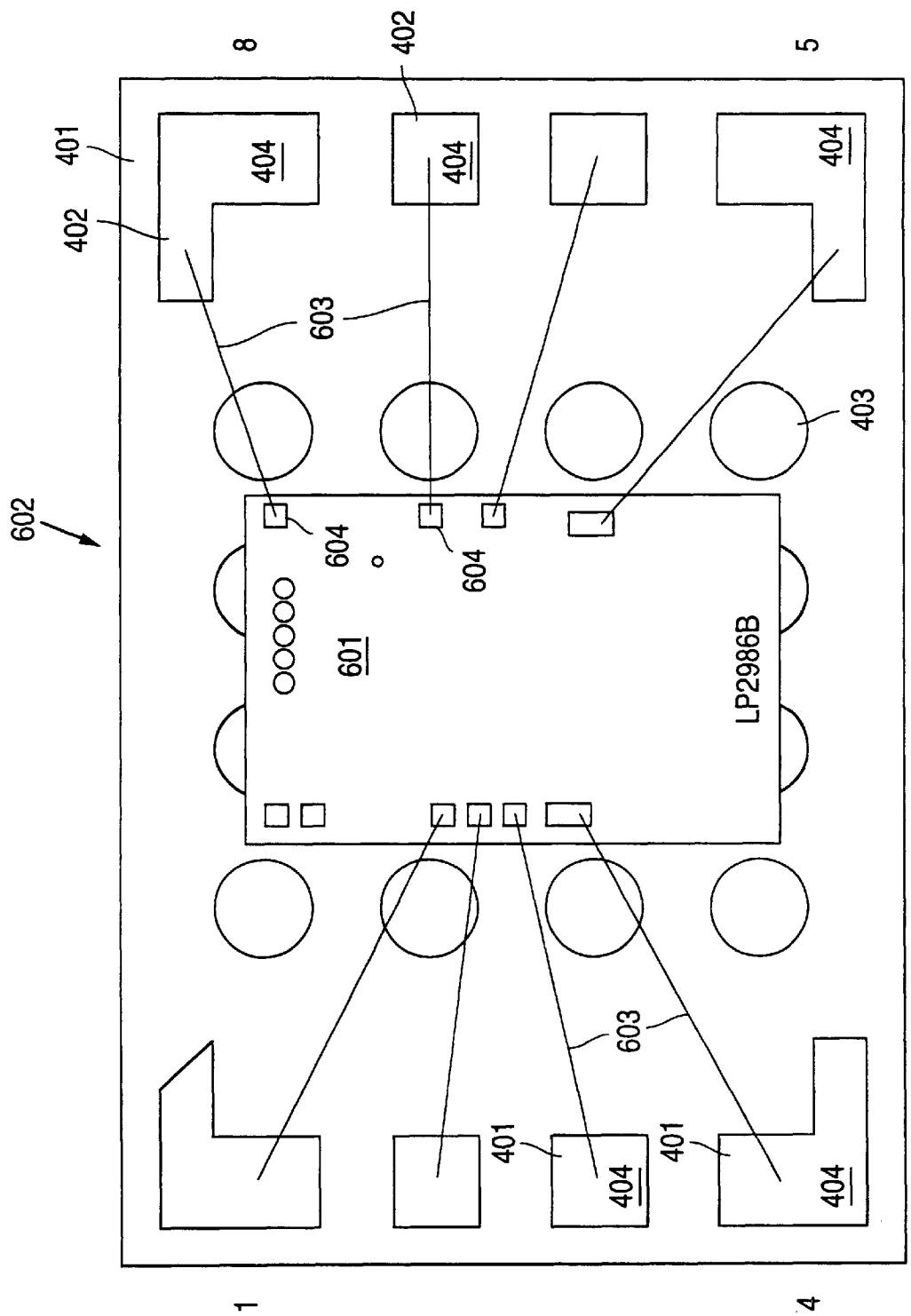
FIG. 6 shows a plan view of integrated circuit die 601 attached to solder mask 401 over a perforated substrate 602.

Conductor layer 408 includes bondable metallic pads 404 to be used in a die-up, wire-bonded configuration. In that configuration, the integrated circuit die is attached by an electrically insulating adhesive on to perforated substrate 400, facing away from conductor layer 408. Electrical connections between bond pads on the integrated circuit and the bondable metallic pads 404 are provided by bond wires through openings 402 of solder mask 401. FIG. 6 shows a plan view of an integrated circuit die 601 attached to solder mask 401 over a perforated substrate 602. As shown in FIG. 6, bond wires 603 electrically couple bonding pads 604 of integrated circuit die 601 to the bondable metallic pads 404 on perforated substrate 602, through openings 402 of solder mask 401.

Referring back to FIG. 4a, openings 410 on the bondable metallic pads 404, corresponding to openings 301 of perforated substrate 300, are provided to allow electrical connections to the other side of perforated substrate core 300 by vias through openings 301. Such vias can be provided by through hole plating, or by filling openings 301 with a solder flux or a conductive paste. The optional conductor layer 409 provides an additional level of flexibility in pin assignment.

Alternatively, a die-down ("flip-chip") configuration can be provided in which the integrated circuit die is attached with its bonding pads facing solder mask 401 and aligned with openings 403. In that configuration electrical connections from the bonding pads of the integrated circuit die to the solder balls on the other side of perforated substrate core 300 are achieved by vias through openings 403 of solder mask 401, openings 301 of perforated substrate core 300 and openings 407 of solder mask 406. Of course, in such a configuration, the bonding pads on the integrated circuit and the openings 403 and 407 are aligned. However, if openings 301 in substrate core 300 are plugged with a conductive paste, so that contact-can be made between the bonding pads of the integrated circuit die, solder masks 401 and 406 can be eliminated. In such an arrangement, the bonding pads on the integrated circuit die can be "pre-bumped" with a solder material for attaching to the conductive paste provided in openings 301. Such an arrangement would not require alignment between the openings in the solder masks and openings 301 of the substrate core. This arrangement is particularly useful in the configuration in which the bonding pads are distributed around the outer periphery of the integrated circuit die.

Figure 5A:
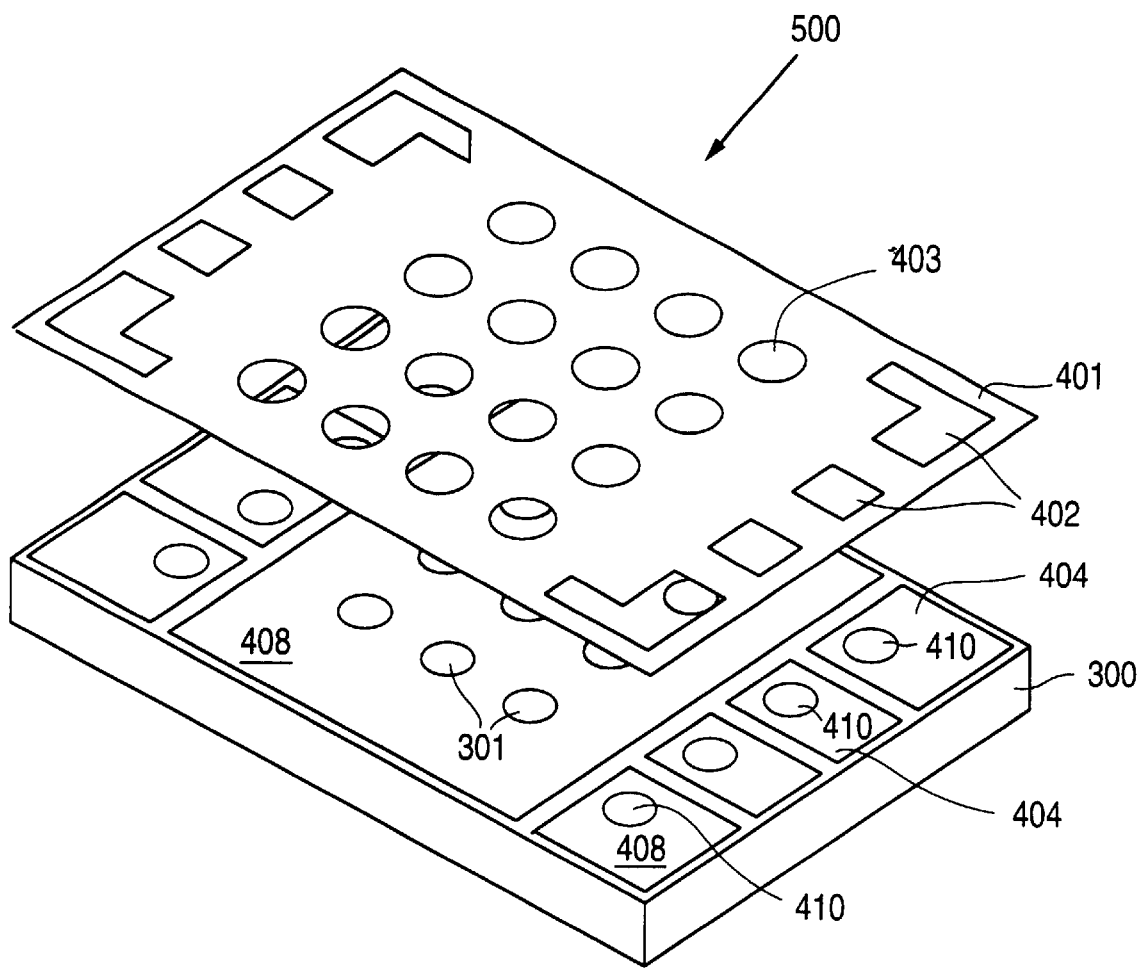

A perforated substrate 500 in another embodiment of the present invention is shown in perspective and side views, respectively, in FIGS. 5a and 5b. Perforated substrate 500 differs from perforated substrate 400 of FIGS. 4a and 4b by not having second solder mask 406 and the additional conductor layer 409. In one implementation, perforated substrate core 300 of perforated substrate 400 is made from a BT material, while perforated substrate core 300 of perforated substrate 500 is made from a high temperature epoxy material. In another single-solder mask substrate, perforated core 300 is made from a flexible polyimide material. A polyimide substrate provides a thinner substrate than BT.

Figure 7A:
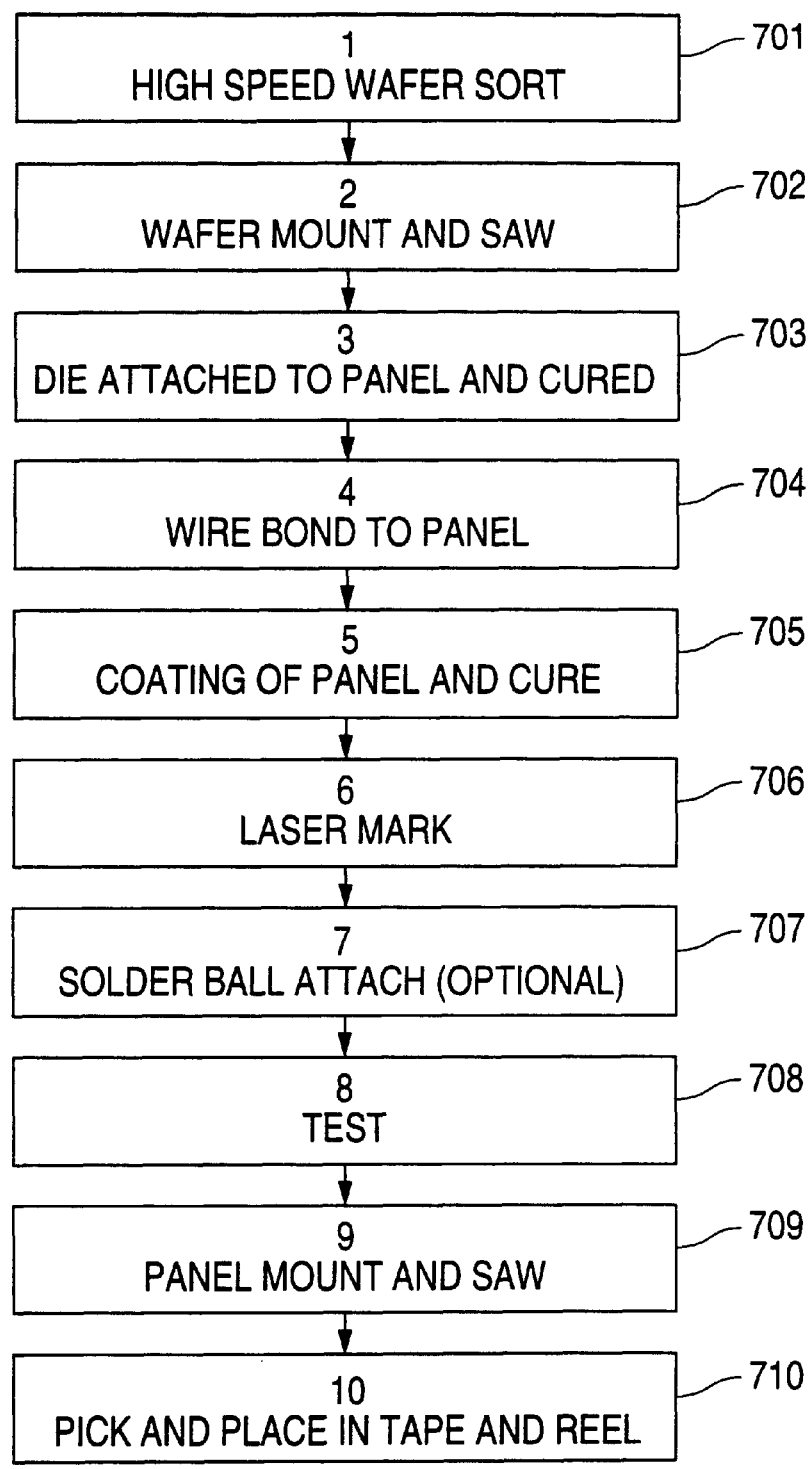
FIG. 7a is a flow chart of an assembly process for manufacturing a CSP, in one embodiment of the present invention.
Figure 7B:
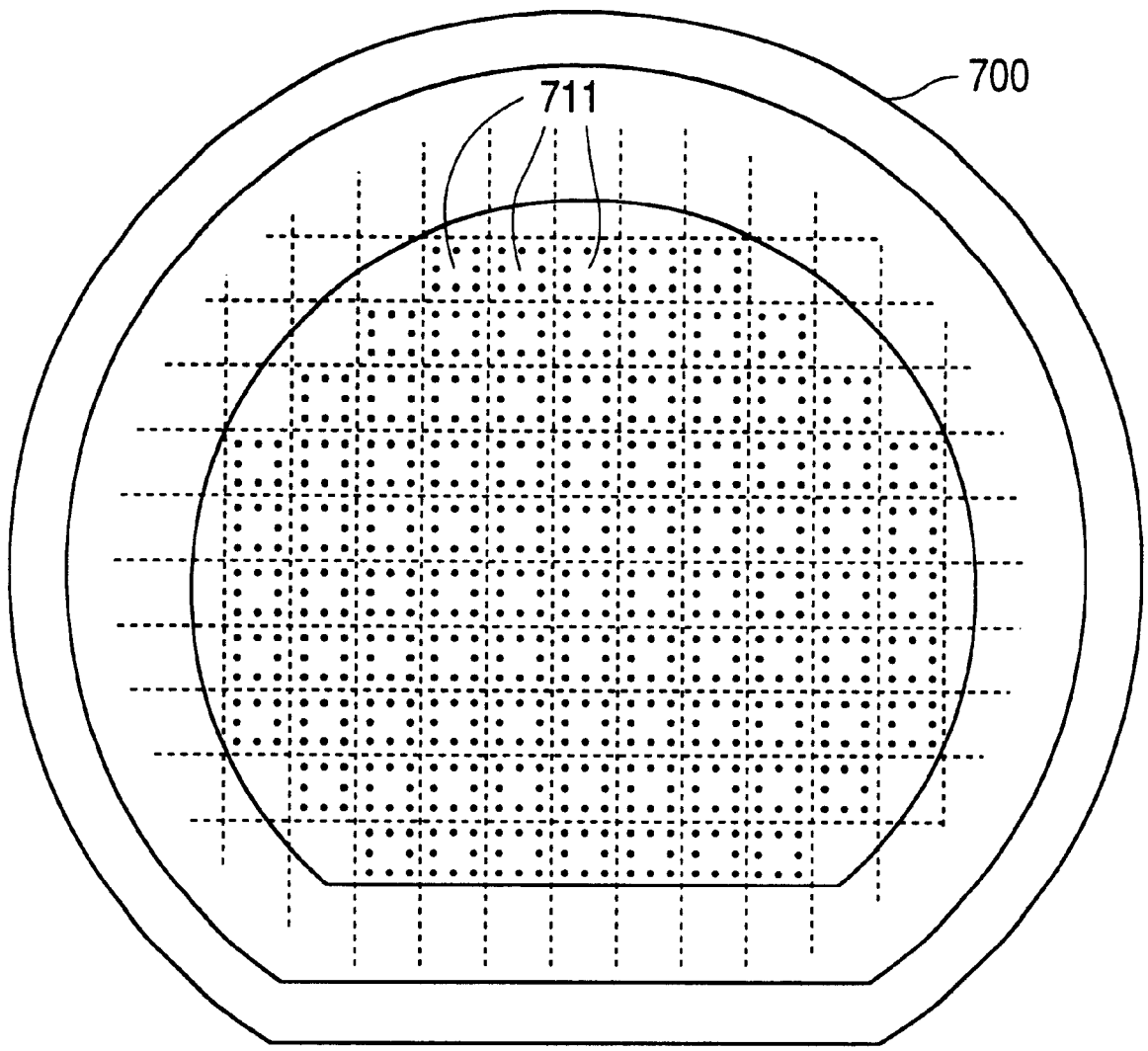
Figure 7C:
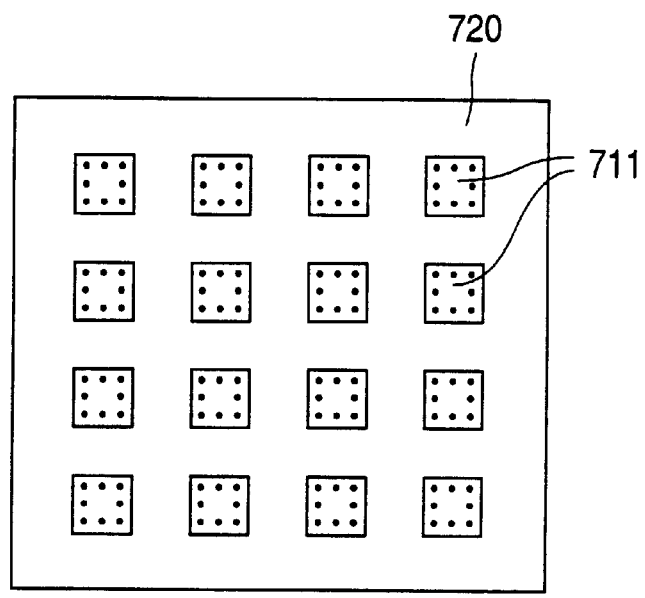

A chip scale package (CSP) is provided by the use of a perforated substrate of the present invention. A CSP is so called because of the relatively small footprint of the package that approximates the surface area of the integrated circuit die contained therein. FIG. 7a is an assembly flow chart used in a process for manufacturing a CSP, in accordance with the present invention. FIGS. 7b–7h show the various stages of a CSP at various steps of the assembly process of FIG. 7a. As shown in FIGS. 7a and 7b, at step 701 ("wafer sort"), a semiconductor wafer 700 on which numerous integrated circuits dies 711 are fabricated is sorted in a conventional manner to identify the non-functional dies. At step 702 ("wafer mount and saw step"), semiconductor wafer 700 is diced (using, for example, a diamond saw) to singulate integrated circuit dies 711. At step 703 ("die attach"), integrated circuit dies 711 are placed and attached individually on to a perforated substrate 720 (FIG. 7c) by a conventional die attach method. Perforated substrate 720 can be provided as (i) a sheet, as shown in FIG. 7c, on which a rectangular array of packages can be formed, (ii) a strip or panel, on which a row of packages can be formed, (iii) any other form suitable for automated processing.

If electrical connections from integrated circuit dies 711 to perforated substrate 720 are to be provided by wire bonds, integrated circuit dies 711 are attached in the "die-up" configuration using, for example, a thermally conductive adhesive. Wire bonding is then performed at step 704. If a "die-down" or "flip-chip" configuration is used, integrated circuit dies 711 are attached aligned by an automated process to the perforations of perforated substrate 720 using, for example, solder bumps to engage the pre-formed vias or bumps in perforated substrate 720. Preformed vias are discussed in the Parent Application incorporated by reference above and thus a description of such preformed vias is not repeated here.

At step 705 ("coating and cure"), an encapsulation is provided to seal integrated circuit dies 711. The encapsulation can be provided by (i) an overcoating, using a die coating or a silk screen printing process, or (ii) a conventional plastic protective material (e.g. epoxy resin), using a liquid encapsulation method, a conventional transfer molding method, or any suitable non-stick molding method. Alternatively, if a cavity package or a hermetically sealed package is desired, a ceramic cap coated with epoxy, or provided a glass seal ring, can also be used over perforated substrate 720.

Figure 8:
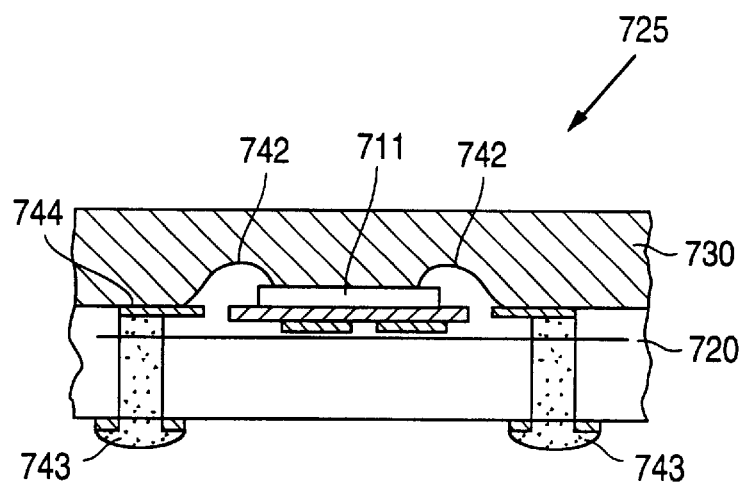
FIG. 8 shows a cross section of encapsulated substrate 725.
Figure 7D:
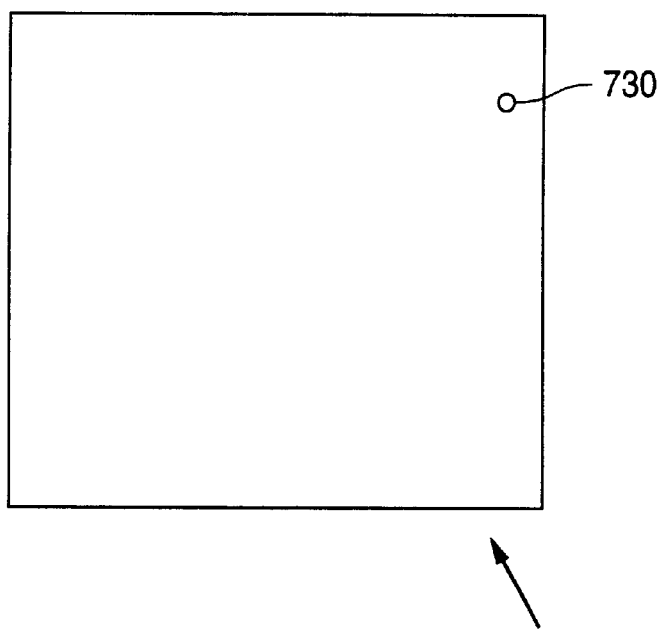

An encapsulated substrate 725, with encapsulation material 730 provided on the top side, is shown in FIG. 7d. A cross section of encapsulated substrate 725 is shown in FIG. 8. FIG. 8 shows encapsulated substrate 725 formed by overcoating perforated substrate 720 with encapsulation material 730 to enclose an integrated circuit die 711. In FIG. 8, integrated circuit die 711 is wire-bonded by bond wires 742 to a conductor layer 744. Electrical connection from outside the CSP is provided, in this instance, by preformed vias 743.

Figure 7E:
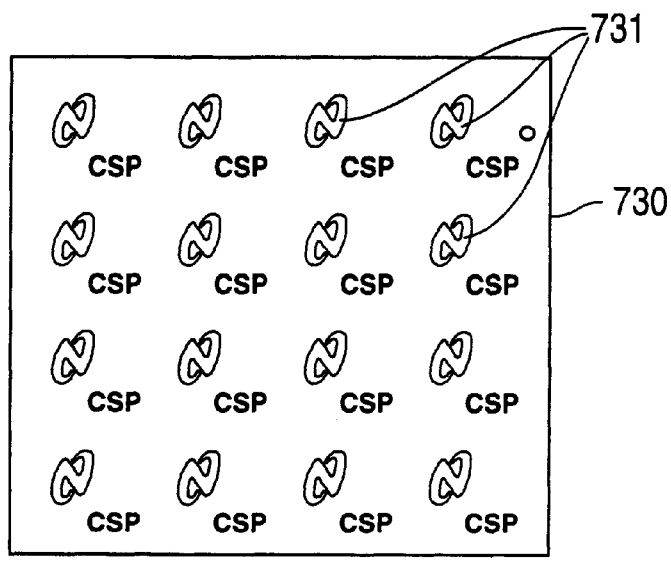
Figure 7F:
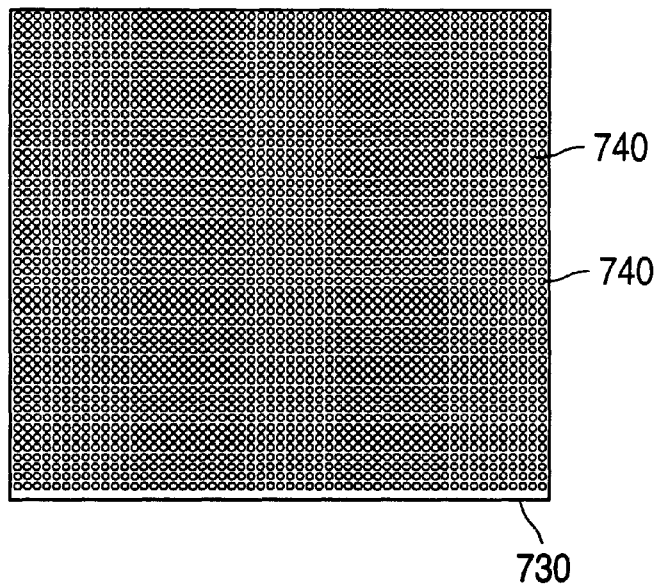
Figure 7G:
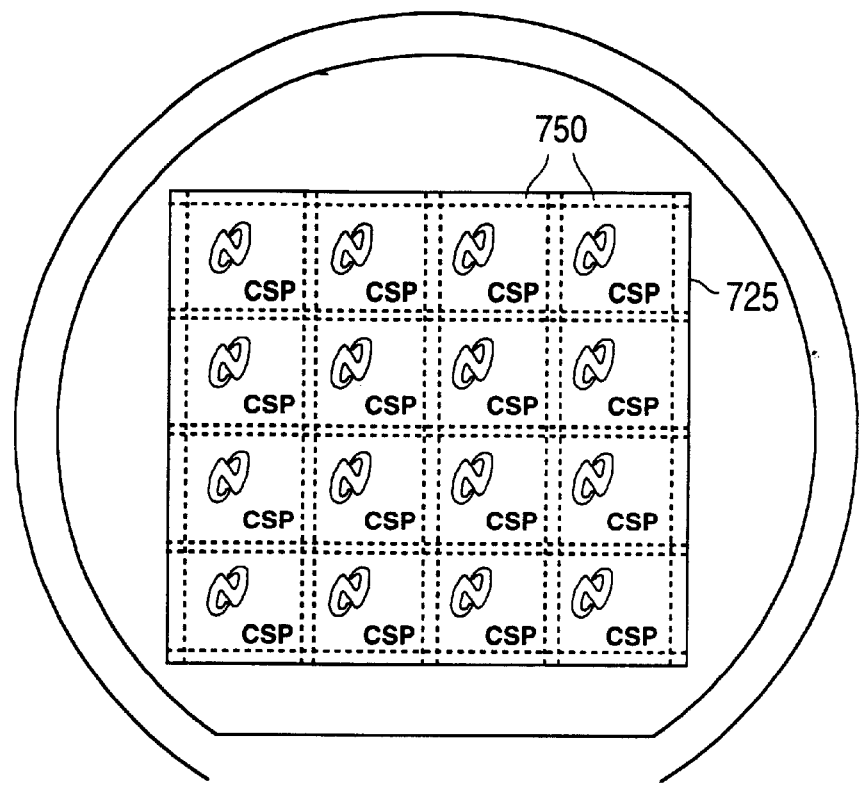

At step 706, encapsulated substrate 725 is marked using, for example, a laser engraving or an inking technique, to provide individual identification and other information to be furnished on the individual finished CSPs (FIG. 7e). If preformed vias are not used, a solder ball attach step 707 is performed in a conventional manner. FIG. 7f shows solder balls 740 provided on encapsulated substrate 725 on an opposite side of encapsulation material 730. Of course, the present invention is not limited to packages using solder balls as terminals for electrical access. Other forms of electrical contacts (e.g. a pin grid or fusible metallization on a system board) can also be provided.

At step 708 ("test"), the encapsulated integrated circuit dies 711 are individually electrically tested through their external terminals (e.g. the solder balls). At step 709 ("mount and saw"), the individual CSPs 750 are singulated from encapsulated substrate 725 (FIG. 7g) using, for example, a diamond saw. A suitable diamond saw includes, for example, a serrated diamond blade with adequate cutting relief. Alternatively, singulation can also be achieved by a mechanical process facilitated by the v-shaped groove discussed in the Parent Application incorporated by reference above.

Figure 7H:
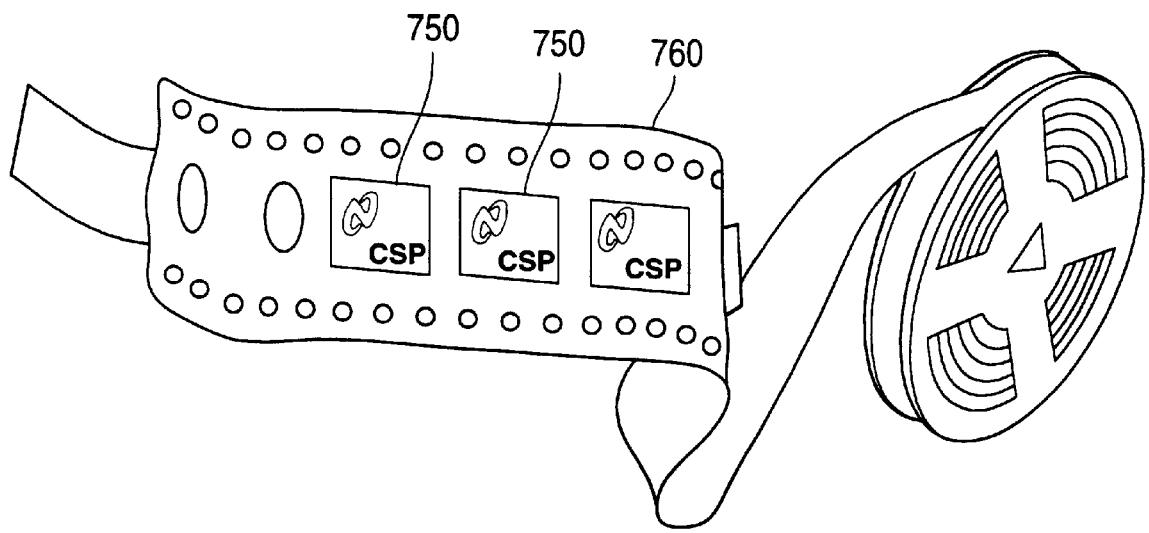

Finally, at step 710, as shown in FIG. 7h, the individual CSPs 750 are attached to a tape 760, provided in a reel form, to facilitate automatic placement in a subsequent system board manufacturing process.

The above detailed description is provided to illustrate specific embodiments of the present invention and does not limit the present invention. Numerous modifications and variations within the scope of the present invention are possible. The present invention is defined by the claims appended hereinbelow.

We claim:

1. An assembly process for manufacturing chip scale packages, comprising the steps of:

providing a perforated substrate;

attaching to said perforated substrate a plurality of semiconductor dies;

providing an electrically insulative covering over said plurality of semiconductor dies to form a sealed structure including said insulative covering and perforated substrate, said seal structure enclosing said semiconductor dies; and singulating said sealed structure into said chip scale packages, such that each chip scale package includes one of said semiconductor dies.

2. An assembly process as in claim 1, wherein said perforated substrate is provided a conductive pattern thereon, said assembly process further comprising the step of electrically connecting terminals on said semiconductor dies to said conductive pattern.

3. An assembly process as in claim 2, wherein said step of electrically connecting terminals on said semiconductor dies comprises the step of wire bonding.

4. An assembly process as in claim 2, further comprising the step of providing preformed vias in said perforated substrate, wherein said step of electrically connecting terminals on said semiconductor dies includes the step of connecting said terminals to said preformed vias.

5. An assembly process as in claim 2, further comprising, prior to said singulation step, the step of providing a plurality of external terminals, said step of providing external terminals electrically connecting said conductive patterns to external terminals.

6. An assembly process as in claim 5, wherein said step of providing external terminals comprises the step of attaching solder balls.

7. An assembly process as in claim 1, further comprising the step of electrically testing each of said semiconductor dies prior to said step of singulating.

8. An assembly process as in claim 1 further comprising, after said step of singulating, the step of attaching said chip scale packages to a tape.

9. An assembly process as in claim 1, wherein said step of singulating uses a diamond saw to cut through said sealed structure.

10. An assembly process as in claim 1, wherein said step of providing an electrically insulative covering includes the step of applying a coating over said semiconductor dies.

11. An assembly process as in claim 1, wherein said step of providing an electrically insulative covering includes the step of plastic encapsulation of said semiconductor dies using a transfer molding method.

12. An assembly process as in claim 1, wherein said step of providing an electrically insulative covering includes the step of plastic encapsulation of said semiconductor dies using a liquid encapsulant.

13. An assembly process as in claim 1, wherein said step of providing an electrically insulative covering includes the step of providing a ceramic cap over said perforated substrate using a glass seal.

* * * * *